US009726552B2

(12) United States Patent
Yanata et al.

(10) Patent No.: US 9,726,552 B2
(45) Date of Patent: Aug. 8, 2017

(54) TEMPERATURE COMPENSATED PIEZOELECTRIC OSCILATOR DEVICE PACKAGE WHEREIN THE BASE OF THE PACKAGE CONSISTS OF A MULTILAYER THERMISTOR

(71) Applicant: TDK CORPORATION, Tokyo (JP)

(72) Inventors: Takeshi Yanata, Tokyo (JP); Yo Saito, Tokyo (JP); Kazuto Takeya, Tokyo (JP); Katsunari Moriai, Tokyo (JP); Takashi Inagaki, Tokyo (JP); Takahiro Itami, Tokyo (JP); Takeshi Oyanagi, Tokyo (JP); Hitoshi Ishida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 375 days.

(21) Appl. No.: 14/642,053

(22) Filed: Mar. 9, 2015

(65) Prior Publication Data

US 2015/0276504 A1    Oct. 1, 2015

(30) Foreign Application Priority Data

Mar. 26, 2014 (JP) .................................. 2014-063890

(51) Int. Cl.
*H01L 41/053* (2006.01)
*H03H 9/08* (2006.01)
(Continued)

(52) U.S. Cl.
CPC .................. *G01K 7/22* (2013.01); *G01K 1/14* (2013.01); *H03H 9/02102* (2013.01);
(Continued)

(58) Field of Classification Search
CPC ........ G01K 1/14; G01K 7/22; H03H 9/02102; H03H 9/0557; H03H 9/1014; H03H 9/1021; H03H 9/0519; H01L 41/0533
See application file for complete search history.

(56) References Cited

U.S. PATENT DOCUMENTS 4,627,533 A * 12/1986 Pollard ................ H03H 9/0528
174/541
6,917,142 B2 * 7/2005 Koyama .............. H03H 9/0547
310/344
(Continued)

FOREIGN PATENT DOCUMENTS

JP    2012-182567 A    9/2012
JP    2013-098608    *  5/2013 ............... H03H 9/02

*Primary Examiner* — Randy Gibson
(74) *Attorney, Agent, or Firm* — Oliff PLC

(57) ABSTRACT

Provided is a piezoelectric device capable of improving measurement precision of a temperature of a piezoelectric element. A piezoelectric device (1) includes a package (2) including a housing member (4) having a thermistor substrate (3) and a frame (7) provided to project from a first main surface (3a) of the thermistor substrate (3) and in which a housing part (6) is formed by the first main surface (3a) and the frame (7) and a lid (9) provided on the frame (7) to cover a space (5) of the housing part (6), and a piezoelectric vibration element (5) provided on the first main surface (3a) of the thermistor substrate (3) in the housing part (6), wherein the thermistor substrate (3) is a multilayer negative temperature coefficient (NTC) thermistor.

2 Claims, 7 Drawing Sheets

(51) Int. Cl.
*G01K 1/14* (2006.01)
*G01K 7/22* (2006.01)
*H03H 9/05* (2006.01)
*H03H 9/02* (2006.01)
*H03H 9/10* (2006.01)

(52) U.S. Cl.
CPC ........ *H03H 9/0519* (2013.01); *H03H 9/0557* (2013.01); *H03H 9/1014* (2013.01); *H03H 9/1021* (2013.01); *H01L 41/0533* (2013.01)

(56) References Cited

U.S. PATENT DOCUMENTS

| | | | | |
|---|---|---|---|---|
| 7,098,580 B2* | 8/2006 | Sasagawa | ............ | H03H 9/1021 310/348 |
| 7,123,107 B2* | 10/2006 | Koyama | ............ | H03H 9/1021 257/724 |
| 7,759,844 B2* | 7/2010 | Miyahara | ............ | H03H 9/0542 310/348 |
| 8,569,937 B1* | 10/2013 | Kubena | ............ | H03H 9/1021 310/309 |
| 8,749,123 B2* | 6/2014 | Muraki | ............ | G01K 7/16 310/346 |
| 9,264,015 B2* | 2/2016 | Kikushima | ............ | H03H 9/0552 |
| 9,287,882 B2* | 3/2016 | Yokoo | ............ | H03H 9/0552 |
| 9,391,586 B2* | 7/2016 | Isohata | ............ | H03H 9/02102 |
| 9,450,166 B2* | 9/2016 | Fujihara | ............ | H01L 41/0475 |
| 9,496,480 B2* | 11/2016 | Naito | ............ | H01L 41/0825 |
| 9,548,717 B2* | 1/2017 | Takase | ............ | H03H 9/0552 |
| 2014/0355646 A1* | 12/2014 | Lee | ............ | H01L 41/25 374/117 |
| 2014/0355647 A1* | 12/2014 | Lee | ............ | H01L 41/25 374/117 |
| 2015/0381184 A1* | 12/2015 | Suzuki | ............ | H03B 5/04 331/156 |

* cited by examiner

TEMPERATURE COMPENSATED PIEZOELECTRIC OSCILATOR DEVICE PACKAGE WHEREIN THE BASE OF THE PACKAGE CONSISTS OF A MULTILAYER THERMISTOR

BACKGROUND OF THE INVENTION

Field of the Invention

The present invention relates to a piezoelectric device.

Related Background Art

As a conventional piezoelectric device, for example, a piezoelectric device disclosed in Japanese Patent Application Laid-Open No. 2012-182567 is known. The piezoelectric device disclosed in Japanese Patent Application Laid-Open No. 2012-182567 includes an element mounting member having a substrate part, a first frame part provided on one main surface of the substrate part, and a second frame part provided on one main surface of the first frame part; a thermistor element provided on the main surface of the substrate part exposed within a second recessed space formed by the substrate part and the first frame part; a piezoelectric vibration element provided on the main surface of the first frame part exposed within a first recessed space formed by the first frame part and the second frame part; and a lid hermetically sealing the first recessed space and the second recessed space.

The above-described piezoelectric device measures a temperature of the piezoelectric vibration element (an ambient temperature of the piezoelectric vibration element) with the chip-shaped thermistor element arranged within the recessed space along with the piezoelectric vibration element. The piezoelectric vibration element is configured with excitation electrodes arranged on both main surfaces of a crystal plate. Heat from the outside (for example, a circuit substrate or the like on which the piezoelectric device is mounted) of the piezoelectric device is transferred to the piezoelectric vibration element via a conductor or the like arranged on the substrate part. At this time, because the piezoelectric vibration element and the thermistor element have significantly different shapes and also have different areas (volumes) of electrodes (metals), heat capacity is different. Thus, in the conventional piezoelectric device, a difference between a real temperature of a piezoelectric vibration element and a measured temperature measured by the thermistor element may occur.

An objective of the present invention is to provide a piezoelectric device capable of improving the measurement precision of a temperature of a piezoelectric element.

SUMMARY OF THE INVENTION

According to an aspect of the present invention, a piezoelectric device includes: a package including an housing member having a base part and a frame-shaped projecting part provided to project from one main surface of the base part and in which an housing part is formed by the one main surface and the projecting part and a lid provided on the projecting part to cover the housing part; and a piezoelectric element provided on the one main surface of the base part in the housing part, wherein the base part is a multilayer negative temperature coefficient (NTC) thermistor.

In the piezoelectric device, the base part on which the piezoelectric element is provided is the multilayer NTC thermistor. In this manner, shapes or metal areas of the piezoelectric element and the thermistor for measuring the temperature of the piezoelectric element can be approximated by configuring the base part on which the piezoelectric element is mounted as the multilayer NTC thermistor. Thereby, it is possible to approximate heat capacities of the piezoelectric element and the multilayer NTC thermistor. As a result, it is possible to improve measurement precision of the temperature of the piezoelectric element in the piezoelectric device.

In an embodiment, the base part may include: a thermistor part on which a plurality of thermistor layers are stacked; first and second internal electrodes arranged to face in a stacking direction of the thermistor layers within the thermistor part; a first external electrode electrically connected to the first internal electrode; and a second external electrode electrically connected to the second internal electrode.

According to the present invention, it is possible to improve the measurement precision of a temperature of a piezoelectric element

DESCRIPTION OF THE PREFERRED EMBODIMENTS

Figure 1:
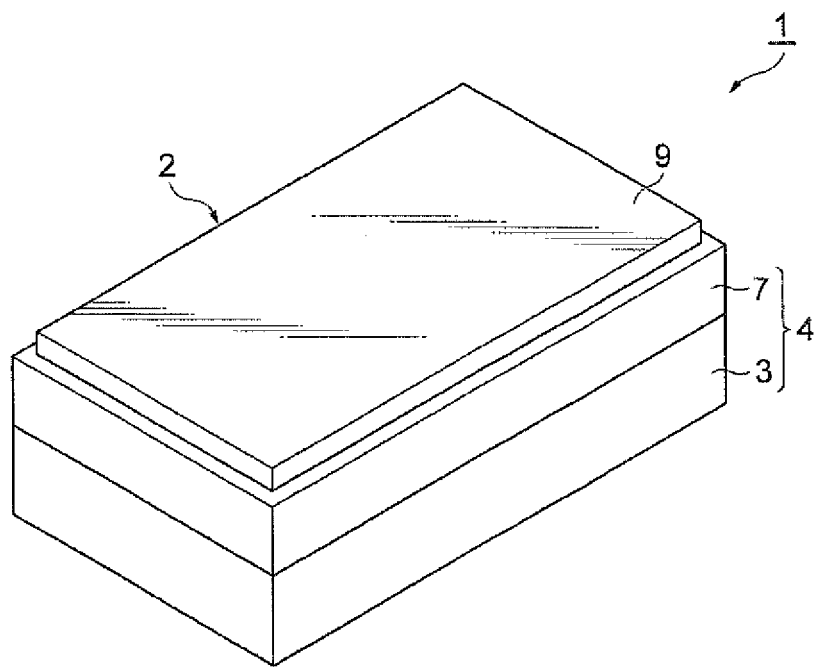
FIG. 1 is a perspective view illustrating a piezoelectric device according to an embodiment.

The preferred embodiments of the present invention will be described below in detail with reference to the accompanying drawings. In the description of the drawings, the same reference numerals denote the same or like elements, and redundant description will be omitted. Dimensional ratios in the drawings do not always coincide with those in the description.

Figure 2:
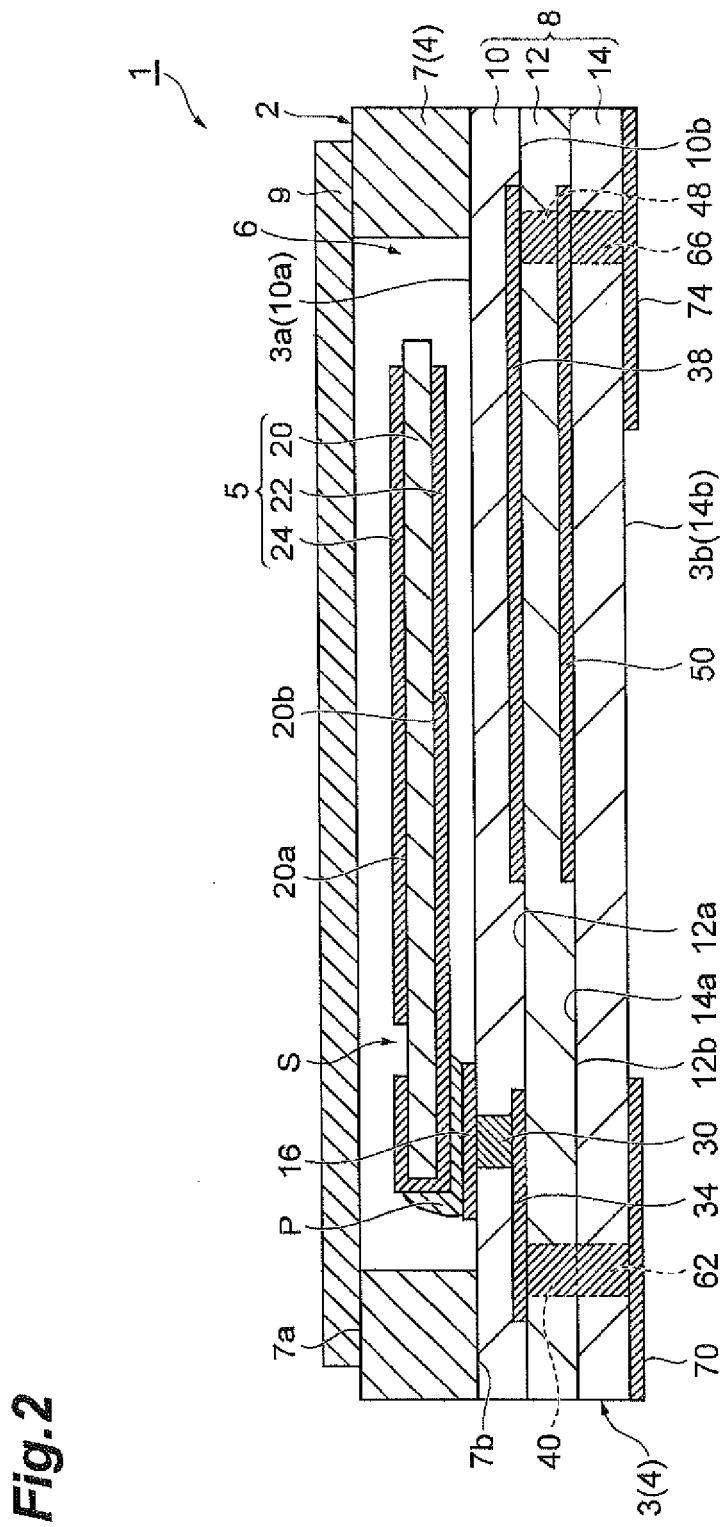
FIG. 2 is a view illustrating a sectional configuration of the piezoelectric device illustrated in FIG. 1.
Figure 3:
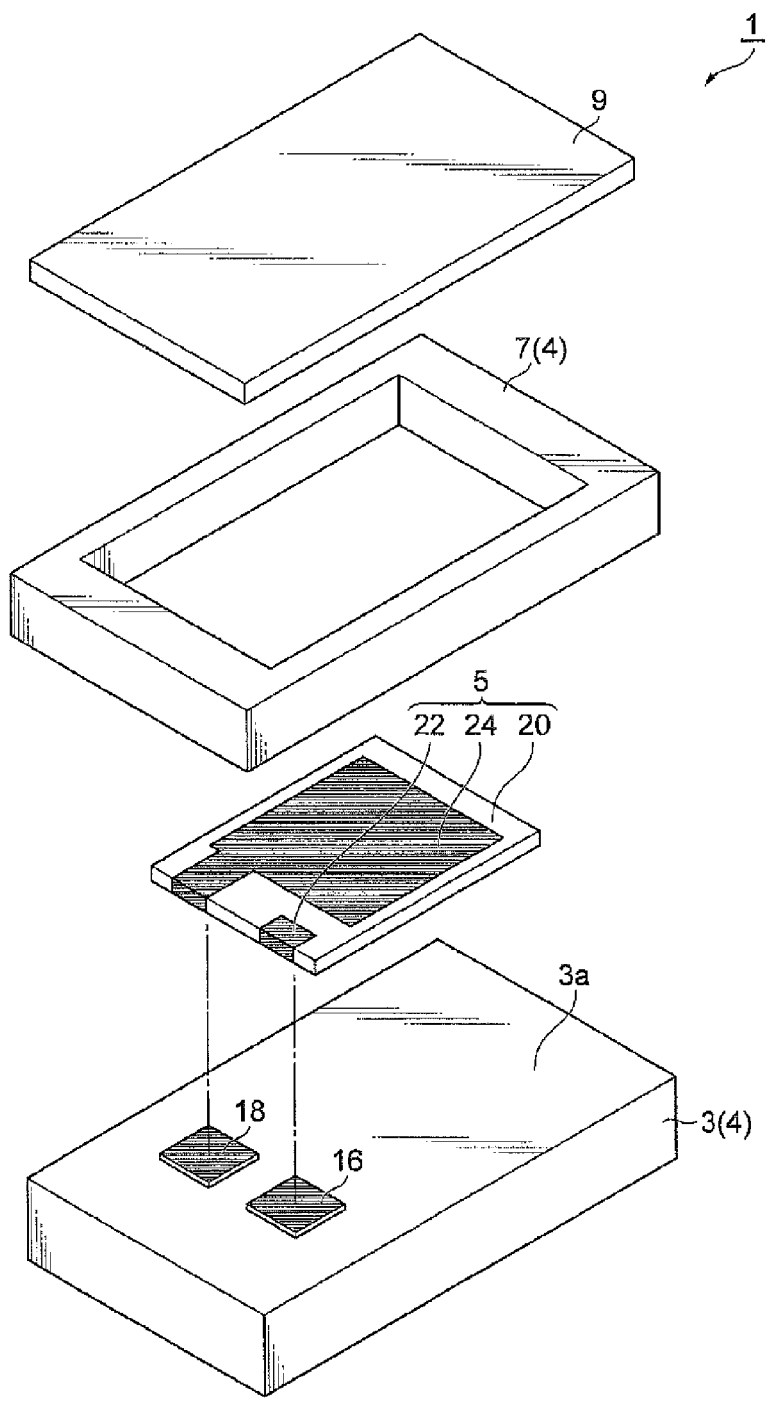
FIG. 3 is an exploded perspective view of the piezoelectric device illustrated in FIG. 1.

FIG. 1 is a perspective view illustrating a piezoelectric device according to an embodiment. FIG. 2 is a view illustrating a sectional configuration of the piezoelectric device illustrated in FIG. 1, FIG. 3 is an exploded perspective view of the piezoelectric device illustrated in FIG. 1. The piezoelectric device 1 illustrated in FIGS. 1 to 3 is a piezoelectric vibration device for oscillating a predetermined frequency by applying and displacing an alternating current (AC) voltage. The piezoelectric device 1 includes a package 2 and a piezoelectric vibration element (piezoelectric element) 5.

The package 2 includes a housing member 4 and a lid 9. The housing member 4 has a thermistor substrate (base part) 3 and a frame (projecting part) 7. In the housing member 4, a housing part 6 is formed by a first main surface 3a of the thermistor substrate 3 (to be described later) and the frame 7. The piezoelectric vibration element 5 is housed in the housing part 6.

The thermistor substrate 3 is a multilayer NTC thermistor, and is a thermistor in which resistance decreases when the temperature increases. The thermistor substrate 3 has a first main surface (one main surface) 3a and a second main surface 3b having rectangular shapes facing each other. In the following description, a long side direction of the first main surface 3a and the second main surface 3b is referred to as a "longitudinal direction" of the thermistor substrate 3 (piezoelectric device 1), a short side direction is referred to as a "width direction" of the thermistor substrate 3 (piezoelectric device 1), and a direction in which the first main surface 3a and the second main surface 3b face is referred to as a "thickness direction" of the thermistor substrate 3 (piezoelectric device 1). Lengths of the first main surface 3a and the second main surface 3b in the longitudinal direction are, for example, 1.5 mm to 4.0 mm. Lengths of the first main surface 3a and the second main surface 3b in the width direction are, for example, 1.0 mm to 3.0 mm. A distance (a thickness of the thermistor substrate 3) between the first main surface 3a and the second main surface 3b in the thickness direction is, for example, 0.1 mm to 0.4 mm.

The thermistor substrate 3 includes a thermistor part 8 having a first thermistor layer 10, a second thermistor layer 12, and a third thermistor layer 14. Each of the first thermistor layer 10, the second thermistor layer 12, and the third thermistor layer 14 has a rectangular shape when viewed in the thickness direction. The first thermistor layer 10, the second thermistor layer 12, and the third thermistor layer 14 are stacked in this order in the thickness direction.

The first thermistor layer 10, the second thermistor layer 12, and the third thermistor layer 14, for example, are formed from ceramics containing metallic oxides of manganese (Mn), nickel (Ni), and cobalt (Co) as main components. The first thermistor layer 10, the second thermistor layer 12, and the third thermistor layer 14, for example, may contain sub-components such as iron (Fe), copper (Cu), aluminum (Al), zirconium (Zr), and the like to adjust properties, in addition to the metallic oxides of Mn, Ni, and Co which are the main components. In addition, in place of the metallic oxides of Mn, Ni, and Co, the thermistor layers may be formed from metallic oxides of both Mn and Ni or metallic oxides of both Mn and Co.

The first thermistor layer 10 has a first main surface 10a and a second main surface 10b having rectangular shapes facing each other. The first main surface 10a corresponds to the first main surface 3a of the thermistor substrate 3. The second thermistor layer 12 has a first main surface 12a and a second main surface 12b having rectangular shapes facing each other. The third thermistor layer 14 has a first main surface 14a and a second main surface 14b having rectangular shapes facing each other. The second main surface 14b corresponds to the second main surface 3b of the thermistor substrate 3. The second main surface 10b of the first thermistor layer 10 and the first main surface 12a of the second thermistor layer 12 are in contact with each other. The second main surface 12b of the second thermistor layer 12 and the first main surface 14a of the third thermistor layer 14 are in contact with each other. The first thermistor layer 10, the second thermistor layer 12, and the third thermistor layer 14 are sintered to be integrated with each other. Thereby, the thermistor part 8 is configured.

On the first main surface 3a of the thermistor substrate 3, for example, metallic piezoelectric element mounting pads 16 and 18 made of gold (Au), platinum (Pt), Ni or the like are provided. The piezoelectric element mounting pad 16 is electrically connected to an external connection port 70 provided on the second main surface 3b via a conductor 30, a relay electrode 34, a conductor 40, and a conductor 62 to be described later. The piezoelectric element mounting pad 18 is electrically connected to an external connection port 72 provided on the second main surface 3b via a conductor 32, a relay electrode 36, a conductor 42, and a conductor 64 to be described later. The external connection ports 70 and 72 are constituted of the same metal as the piezoelectric element mounting pads 16 and 18.

The frame 7 is a sintered body provided along each side constituting the first main surface 3a. This sintered body is formed by firing a frame-shaped green body of a single layer or a plurality of stacked frame-shaped green bodies. The frame 7 is provided on the first main surface 3a of the thermistor substrate 3. That is, the frame 7 is provided to project from the first main surface 3a of the thermistor substrate 3. The frame 7 is configured to form a rectangular space S when viewed in the thickness direction. The frame 7 has a first surface 7a and a second surface 7b facing each other, and the first surface 7a is in contact with the first main surface 3a of the thermistor substrate 3. The length of the frame 7 in the thickness direction is, for example, 0.3 mm to 0.6 mm, and the width of the frame 7 is, for example, 0.2 mm to 0.4 mm.

Figure 4:
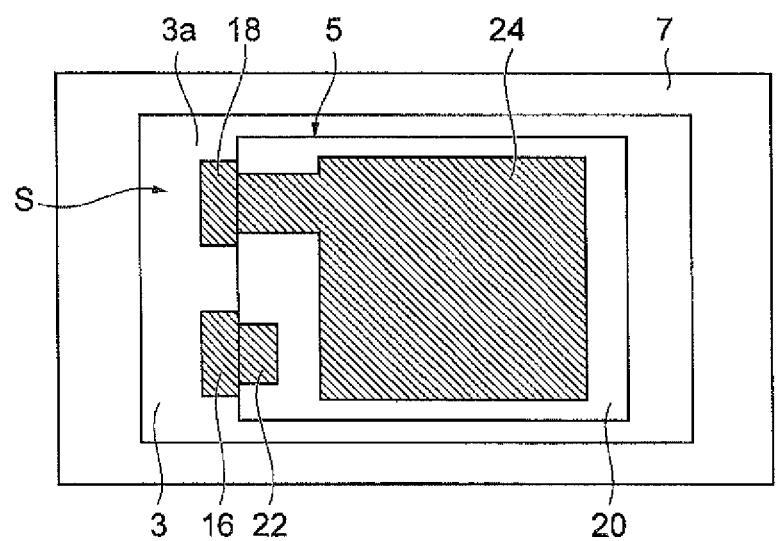
FIG. 4 is a view illustrating a planar configuration of a piezoelectric element and a frame.

As illustrated in FIG. 4, the frame 7 is provided on the first main surface 3a of the thermistor substrate 3 so as to surround the piezoelectric vibration element 5 when viewed in the thickness direction. The piezoelectric vibration element 5 is housed within the space S (housing part 6) so that the piezoelectric vibration element 5 is not in contact with the frame 7.

The lid 9 is a rectangular parallelepiped lid which is provided on the second surface 7b of the frame 7 to cover the housing part 6 (space S). The lid 9, for example, is formed of a metal such as Ni or an alloy such as Kovar (an Fe—Ni—Co alloy). The lid 9 is coupled to the second surface 7b of the frame 7 by resistance welding. This coupling, for example, is performed by seam welding in which a current flows through the lid 9 and the frame 7. In this embodiment, an area of the lid 9 when viewed in the thickness direction is less than an area of the first main surface 3a of the thermistor substrate 3. Also, the area of the lid 9 may be the same as the area of the first main surface 3a of the thermistor substrate 3.

The piezoelectric vibration element 5 has a function of vibrating at a predetermined frequency when AC voltage is applied. As illustrated in FIGS. 2 and 3, the piezoelectric vibration element 5 includes a crystal substrate 20 having a first main surface 20a and a second main surface 20b having rectangular shapes facing each other, a metallic electrode 24 mainly provided on the first main surface 20a, and a metallic electrode 22 mainly provided on the second main surface 20b. The electrode 22 is connected to the piezoelectric element mounting pad 16 via a conductive paste P. The electrode 24 is connected to the piezoelectric element mounting pad 18 via a conductive paste. The conductive paste P is a resin in which conductive particles of a metal (for example, Au, Ag, Pt, or Ni) or the like are dispersed.

Figure 5A:
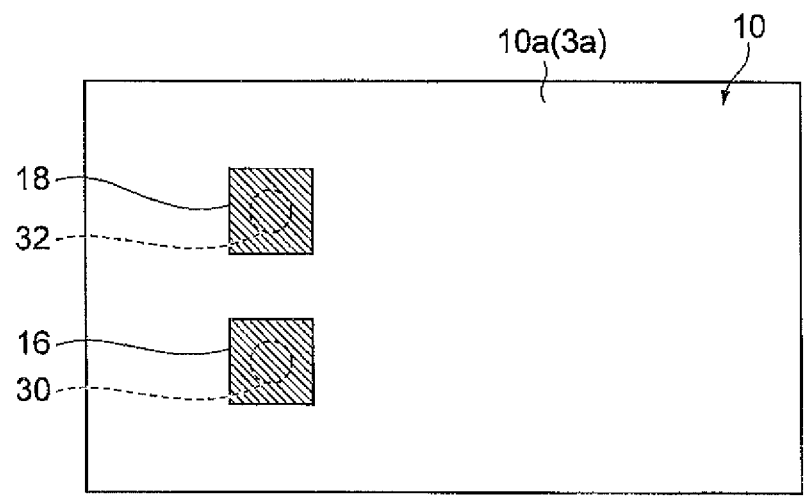
FIG. 5A is a plan view of a first thermistor layer.
Figure 5B:
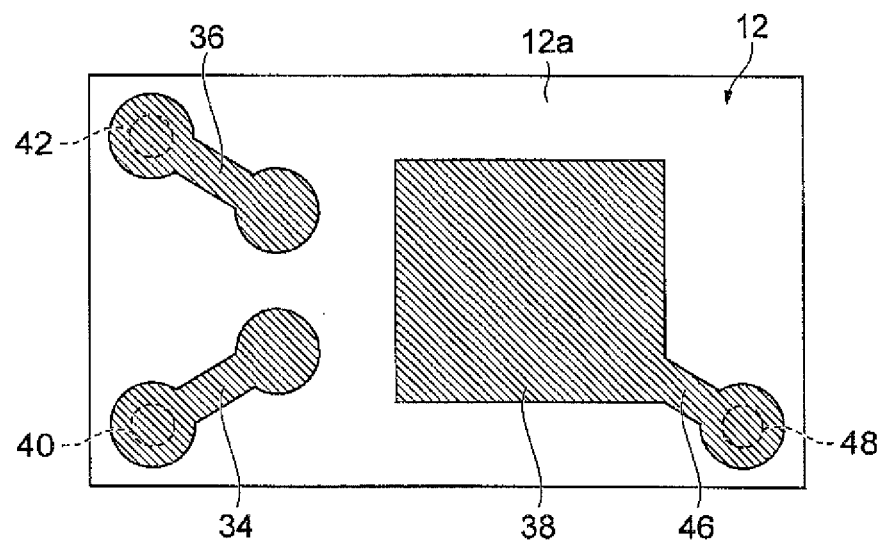
FIG. 5B is a plan view of a second thermistor layer.
Figure 6A:
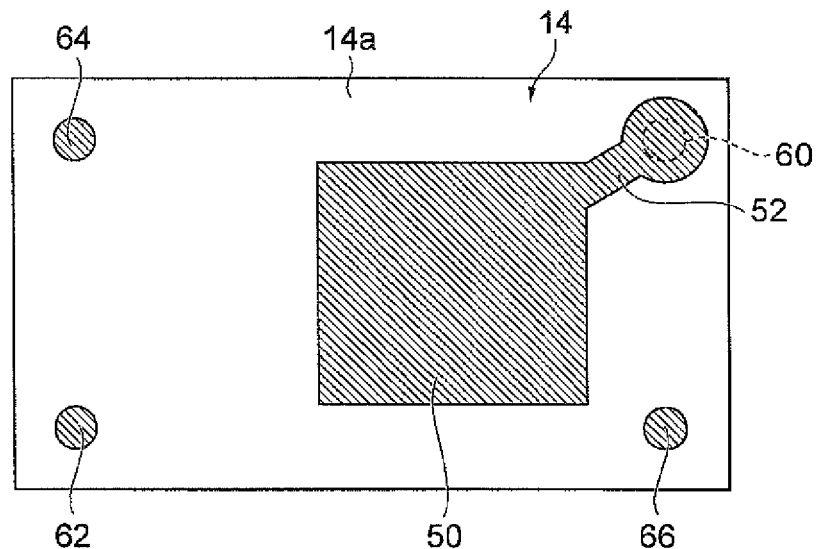
FIGS. 6A and 6B are plan views of a third thermistor layer.
Figure 6B:
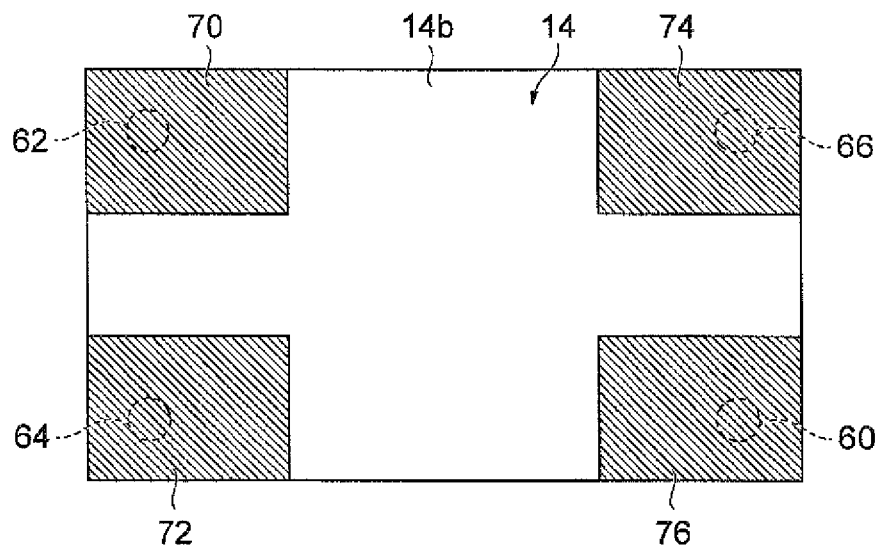

Next, a configuration of the thermistor substrate 3 will be described in further detail with reference to FIGS. 5A, 5B, 6A, and 6B. FIG. 5A is a plan view of a first thermistor layer. FIG. 5B is a plan view of a second thermistor layer. FIGS. 6A and 6B are plan views of a third thermistor layer.

As illustrated in FIG. 5A, the piezoelectric element mounting pads 16 and 18 are arranged on the first main surface 10a of the first thermistor layer 10 (the first main surface 3a of the thermistor substrate 3). The piezoelectric element mounting pads 16 and 18 are arranged at predetermined intervals in the width direction. The piezoelectric element mounting pads 16 and 18, for example, are metals such as Au, Pt, or Ni. A through hole penetrating in the thickness direction is provided in a portion overlapping the piezoelectric element mounting pad 16 in the first thermistor layer 10, and the conductor 30 is arranged within the through hole. Likewise, a through hole penetrating in the thickness direction is provided in a portion overlapping the piezoelectric element mounting pad 18 in the first thermistor layer 10, and the conductor 32 is arranged within the through hole. The conductors 30 and 32 are constituted of the same metal as the piezoelectric element mounting pads 16 and 18.

As illustrated in FIG. 5B, the metallic relay electrodes 34 and 36 and a first internal electrode 38 are arranged on the first main surface 12a of the second thermistor layer 12. The relay electrodes 34 and 36 and the first internal electrode 38 are electrically insulated from each other. The relay electrode 34 is connected to the conductor 30 arranged on the first thermistor layer 10. The relay electrode 36 is connected to the conductor 32 arranged on the first thermistor layer 10. A through hole penetrating in the thickness direction is provided in a portion overlapping the relay electrode 34 in the second thermistor layer 12, and the conductor 40 is arranged within the through hole. Likewise, a through hole penetrating in the thickness direction is provided in a portion overlapping the relay electrode 36 in the second thermistor layer 12, and the conductor 42 is arranged within the through hole. The conductors 40 and 42 are constituted of the same metal as the relay electrodes 34 and 36.

The first internal electrode 38 has a rectangular shape. An extraction electrode 46 extending from a corner of the first internal electrode 38 to a corner of the second thermistor layer 12 is connected to the first internal electrode 38. A through hole penetrating in the thickness direction is provided in a portion overlapping the extraction electrode 46 in the second thermistor layer 12 and a conductor 48 is arranged within the through hole. The first internal electrode 38, the extraction electrode 46, and the conductor 48 are constituted of the same metal.

As illustrated in FIG. 6A, a second internal electrode 50 is arranged on the first main surface 14a of the third thermistor layer 14. The second internal electrode 50 has a rectangular shape. An extraction electrode 52 extending from a corner of the second internal electrode 50 to a corner of the third thermistor layer 14 is connected to the second internal electrode 50. A through hole penetrating in the thickness direction is provided in a portion overlapping the extraction electrode 52 in the third thermistor layer 14 and a conductor 60 is arranged within the through hole. The first internal electrode 38, the extraction electrode 52, and the conductor 60 are constituted of the same metal.

In addition, as illustrated in FIG. 6A, in the third thermistor layer 14, a through hole penetrating in the thickness direction is provided in a portion corresponding to the conductor 40 of the second thermistor layer 12 and a conductor 62 is arranged within the through hole. In the third thermistor layer 14, a through hole penetrating in the thickness direction is provided in a portion corresponding to the conductor 42 of the second thermistor layer 12 and a conductor 64 is arranged within the through hole. In the third thermistor layer 14, a through hole penetrating in the thickness direction is provided in a portion corresponding to the conductor 48 of the second thermistor layer 12 and a conductor 66 is arranged within the through hole.

As illustrated in FIG. 6B, metallic external connection ports 70, 72, 74, and 76 for connecting and mounting the piezoelectric device 1 to an external device are provided on the second main surface 14b of the third thermistor layer 14 (the second main surface 3b of the thermistor substrate 3). The external connection ports 70, 72, 74, and 76 have rectangular shapes when viewed in the thickness direction and are provided in correspondence with vertices (corners) of the second main surface 14b.

The external connection port 70 is in contact with the conductor 62. That is, the external connection port 70 is electrically connected to the piezoelectric element mounting pad 16 via the conductor 30, the relay electrode 34, the conductor 40, and the conductor 62. The external connection port 72 is in contact with the conductor 64. That is, the external connection port 72 is electrically connected to the piezoelectric element mounting pad 18 via the conductor 32, the relay electrode 36, the conductor 42, and the conductor 64.

An external connection port (first external electrode) 74 is in contact with a conductor 66. That is, the external connection port 74 is electrically connected to the first internal electrode 38 via the extraction electrode 46, the conductor 48, and the conductor 66. An external connection port (second external electrode) 76 is in contact with the conductor 60. That is, the external connection port 76 is electrically connected to the second internal electrode 50 via the extraction electrode 52 and the conductor 66.

As described above, in the piezoelectric device 1 of this embodiment, the thermistor substrate 3 on which the piezoelectric vibration element 5 is provided is a multilayer NTC thermistor. In this manner, it is possible to approximate shapes or metal areas of the piezoelectric vibration element 5 and the thermistor for measuring a temperature of the piezoelectric vibration element 5 by configuring the substrate on which the piezoelectric vibration element 5 is mounted as the multilayer NTC thermistor. Thereby, it is possible to approximate heat capacities of the piezoelectric vibration element 5 and the thermistor substrate 3. As a result, in the piezoelectric device 1, it is possible to improve the precision of temperature measurement of the piezoelectric vibration element 5. In addition, external heat of the piezoelectric device 1 is transferred to the piezoelectric vibration element 5 via the conductor arranged on the thermistor substrate 3. Thus, because the heat transferred to the piezoelectric vibration element 5 is also transferred to the thermistor substrate 3, the measurement of a temperature containing the heat is performed in the thermistor substrate 3. Therefore, in the piezoelectric device 1, it is possible to precisely measure the temperature of the piezoelectric vibration element 5.

In addition, it is not necessary to secure a region (space) in which a thermistor element is arranged in the vicinity of the piezoelectric vibration element 5 in the housing part 6 of the housing member 4 by configuring the thermistor for measuring the temperature of the piezoelectric vibration element 5 as the thermistor substrate 3 on which the piezoelectric vibration element 5 is provided. Therefore, in the piezoelectric device 1, it is possible to promote size reduction (height reduction).

In this embodiment, the thermistor substrate 3 includes the thermistor part 8 in which the first thermistor layer 10, the second thermistor layer 12, and the third thermistor layer 14 are stacked and the first internal electrode 38 and the second internal electrode 50 arranged to face in the stacking direction of the first thermistor layer 10, the second thermistor layer 12, and the third thermistor layer 14 within the thermistor part 8. In the conventional piezoelectric device, the temperature of the piezoelectric vibration element is measured by a chip thermistor element. Because the chip thermistor element is small, an influence on a resistance value due to precision of overlapping of the internal electrode arranged in a thermistor element assembly is large and a problem of occurrence of a deviation in the resistance value may occur. On the other hand, compared to the chip thermistor element, the piezoelectric device 1 of this embodiment increases the size because the multilayer NTC thermistor is configured by the thermistor substrate 3. Thus, in the thermistor substrate 3, it is possible to suppress a deviation of a resistance value due to precision of overlapping of an internal electrode because a facing area of the first internal electrode 38 and the second internal electrode 50 can be secured. Therefore, in the piezoelectric device 1, it is possible to improve the performance of the thermistor substrate 3. As a result, it is possible to improve the precision of temperature measurement of the piezoelectric vibration element 5.

Although the preferred embodiments of the present invention have been described above, specific configurations are not necessarily limited to the above-described embodiments, and various changes are possible without departing from the scope of the present invention.

Figure 7:
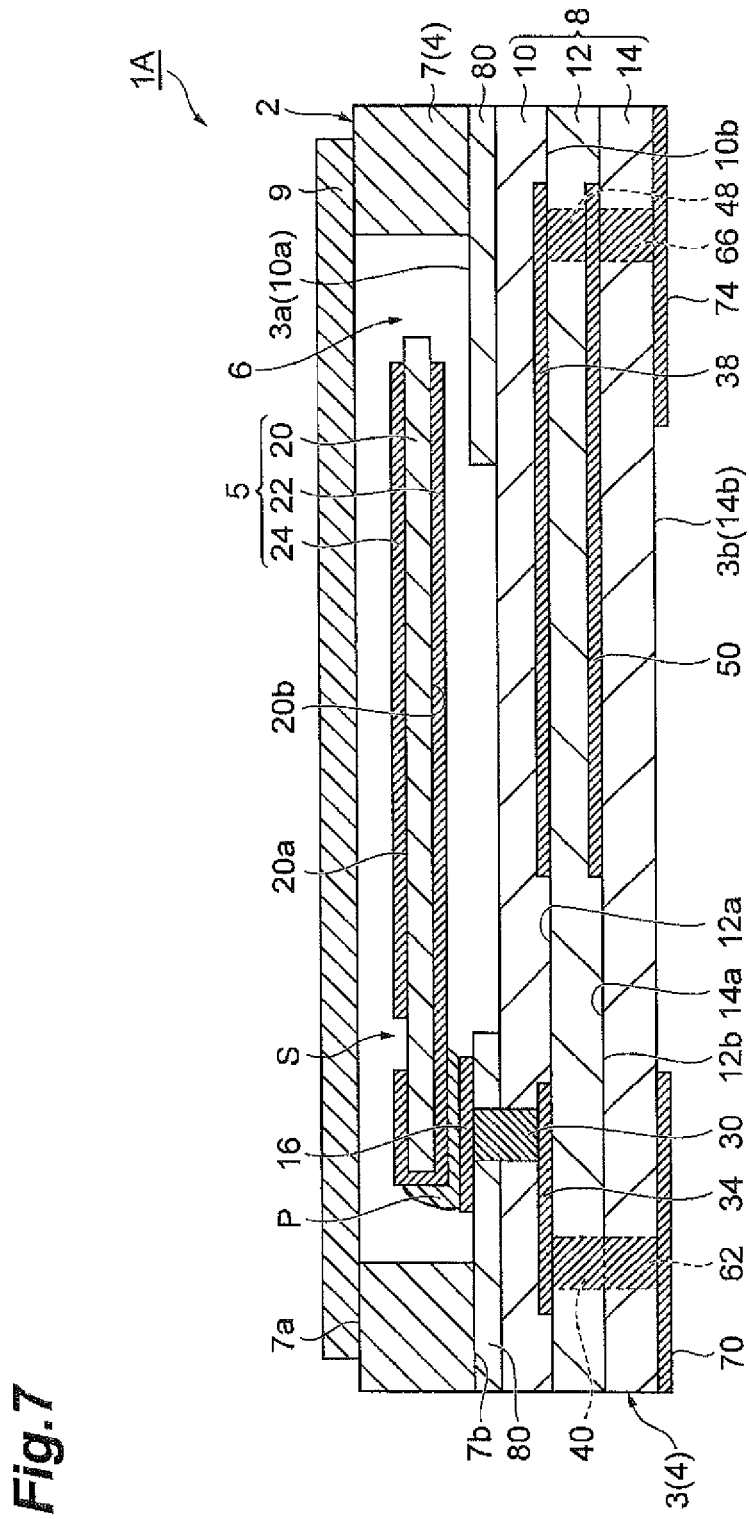
FIG. 7 is a view illustrating a sectional configuration of a piezoelectric device according to another embodiment.

FIG. 7 is a view illustrating a sectional configuration of a piezoelectric device according to another embodiment. As illustrated in FIG. 7, in a piezoelectric device 1A, a plate-shaped member 80 containing oxides such as Al, silicon (Si), and zinc (Zn) oxides may be provided between the thermistor substrate 3 and the frame 7.

Although an example of a configuration in which the thermistor substrate 3 includes the thermistor part 8 constituted of the first thermistor layer 10, the second thermistor layer 12, and the third thermistor layer 14 has been described in the above-described embodiment, the number of stacked layers of the thermistor part 8 is not limited thereto. In addition, the number of internal electrodes arranged on the thermistor substrate may also be set appropriately according to the number of stacked layers of the thermistor part.

In addition, a planar shape of the thermistor substrate 3 is not limited to a rectangular shape illustrated in FIG. 3, and can be appropriately changed to a circular shape, a hexagonal shape, or the like in accordance with a position to which the piezoelectric device 1 is applied. In this case, the housing part 6 formed by the thermistor substrate 3 and the frame 7 may be appropriately changed to a circular shape, a hexagonal shape, or the like.

What is claimed is:

1. A piezoelectric device comprising:
a package including a housing member having a base part and a frame-shaped projecting part provided to project from one main surface of the base part and in which a housing part is formed by the one main surface and the projecting part and a lid provided on the projecting part to cover the housing part; and
a piezoelectric element provided on the one main surface of the base part in the housing part,
wherein the base part is a multilayer negative temperature coefficient (NTC) thermistor.

2. The piezoelectric device of claim 1, wherein the base part includes:
a thermistor part on which a plurality of thermistor layers are stacked;
first and second internal electrodes arranged to face in a stacking direction of the thermistor layers within the thermistor part;
a first external electrode electrically connected to the first internal electrode; and
a second external electrode electrically connected to the second internal electrode.

\* \* \* \* \*